(12) United States Patent
Kojima (10) Patent No.: US 6,229,382 B1
(45) Date of Patent: May 8, 2001

(54) MOS SEMICONDUCTOR INTEGRATED CIRCUIT HAVING A CURRENT MIRROR

(75) Inventor: Makoto Kojima, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/151,736

(22) Filed: Sep. 11, 1998

(30) Foreign Application Priority Data

Sep. 12, 1997  (JP) .................................................. 9-248949

(51) Int. Cl.[7] ........................................................ H03K 3/01
(52) U.S. Cl. ............................ 327/538; 327/543; 323/315
(58) Field of Search ..................................... 327/530, 538, 327/543; 323/312, 315

(56) References Cited

U.S. PATENT DOCUMENTS

| 5,307,007 | * | 4/1994 | Wu et al. | 323/313 |
| 5,680,038 | * | 10/1997 | Fieldler | 323/315 |
| 5,696,459 | * | 12/1997 | Neugebauer et al. | 327/108 |
| 5,952,884 | * | 9/1999 | Ide | 330/288 |

OTHER PUBLICATIONS

R. Thewes, et al., "Hot Carrier Induced Degradation of CMOS Current Mirrors and Current Sources", 1996 IEEE IEDM 96, pp. 885–888, 1996.

* cited by examiner

Primary Examiner—Jung Ho Kim
(74) Attorney, Agent, or Firm—McDermott, Will & Emery (57) ABSTRACT

The MOS semiconductor integrated circuit of the present invention includes: a plurality of serial transistors serially and sequentially connected to the drain of an output transistor of a current mirror circuit receiving input current; a plurality of reference voltage transistors, each connected serially between the gate of an associated one of the serial transistors and ground; PMOS transistors each supplying constant current to an associated one of the reference voltage transistors; an input transistor of an output current mirror circuit, which is connected to the drain of one of the serial transistors that is closest to the input transistor of the output current mirror circuit; and an output transistor of the output current mirror circuit for supplying output current.

19 Claims, 8 Drawing Sheets

MOS SEMICONDUCTOR INTEGRATED CIRCUIT HAVING A CURRENT MIRROR

BACKGROUND OF THE INVENTION

The present invention relates to an MOS semiconductor integrated circuit including a current mirror circuit.

A conventional MOS semiconductor integrated circuit will be described with reference to FIGS. 6 to 8.

Figure 6:
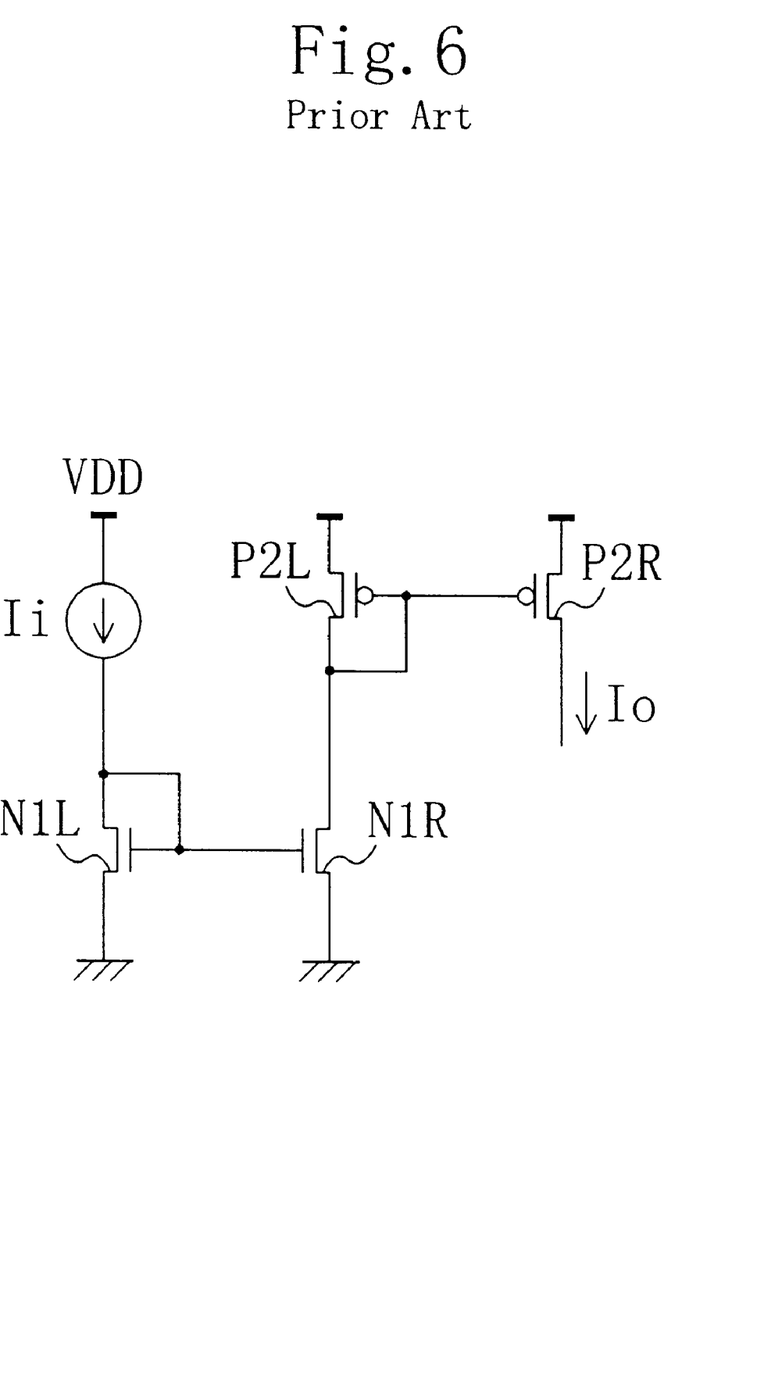
FIG. 6 is a circuit diagram of a current mirror circuit included in a conventional MOS semiconductor integrated circuit.

FIG. 6 is a circuit diagram of a current mirror circuit in a conventional MOS semiconductor integrated circuit. In FIG. 6, an output transistor N1R and an input transistor N1L, which is connected to operate as a diode, are both NMOS transistors and constitute an Nch current mirror circuit. On the other hand, an output transistor P2R and an input transistor P2L, which is connected to operate as a diode, are both PMOS transistors and constitute a Pch current mirror circuit functioning as an output current mirror circuit. The output of the Nch current mirror circuit is connected to the drain of the input transistor P2L of the Pch current mirror circuit.

The operation of the current mirror circuit shown in FIG. 6 will be described.

When a power supply voltage VDD is applied to the Nch current mirror circuit, input current Ii flowing through the input transistor N1L is mirrored by the output transistor N1R. The current flowing through the input transistor P2L of the Pch current mirror circuit, to which transistor the output of the Nch current mirror circuit is connected, is mirrored by the output transistor P2R. Output current Io, i.e., the mirrored current, is supplied by the Pch current mirror circuit.

Herein, the current amplification factors of the input transistor N1L and the output transistor N1R are denoted by βL and βR, respectively. Current equal to the product of the mirror ratio βR/βL of the output and input transistors and the input current Ii flows through the output transistor N1R. Herein, the mirror ratio is assumed to be 1 for the sake of simplicity. In such a case, the current, which is equal to the input current Ii, flows through the output transistor N1R and drives the input transistor P2L of the Pch current mirror circuit connected to the output transistor N1R as a load thereof. The mirror ratio of the Pch current mirror circuit is also assumed to be 1 for the sake of simplicity. Then, the output current Io of the Pch current mirror circuit is equal to the input current Ii of the Nch current mirror circuit. By appropriately determining the mirror ratios of the respective current mirror circuits, the output current Io corresponding to the input current Ii can be supplied.

However, in this conventional configuration, if the power supply voltage is increased in an actual circuit, the current mirroring precision is deteriorated to a large degree. The reasons thereof will be described below.

Figure 7:
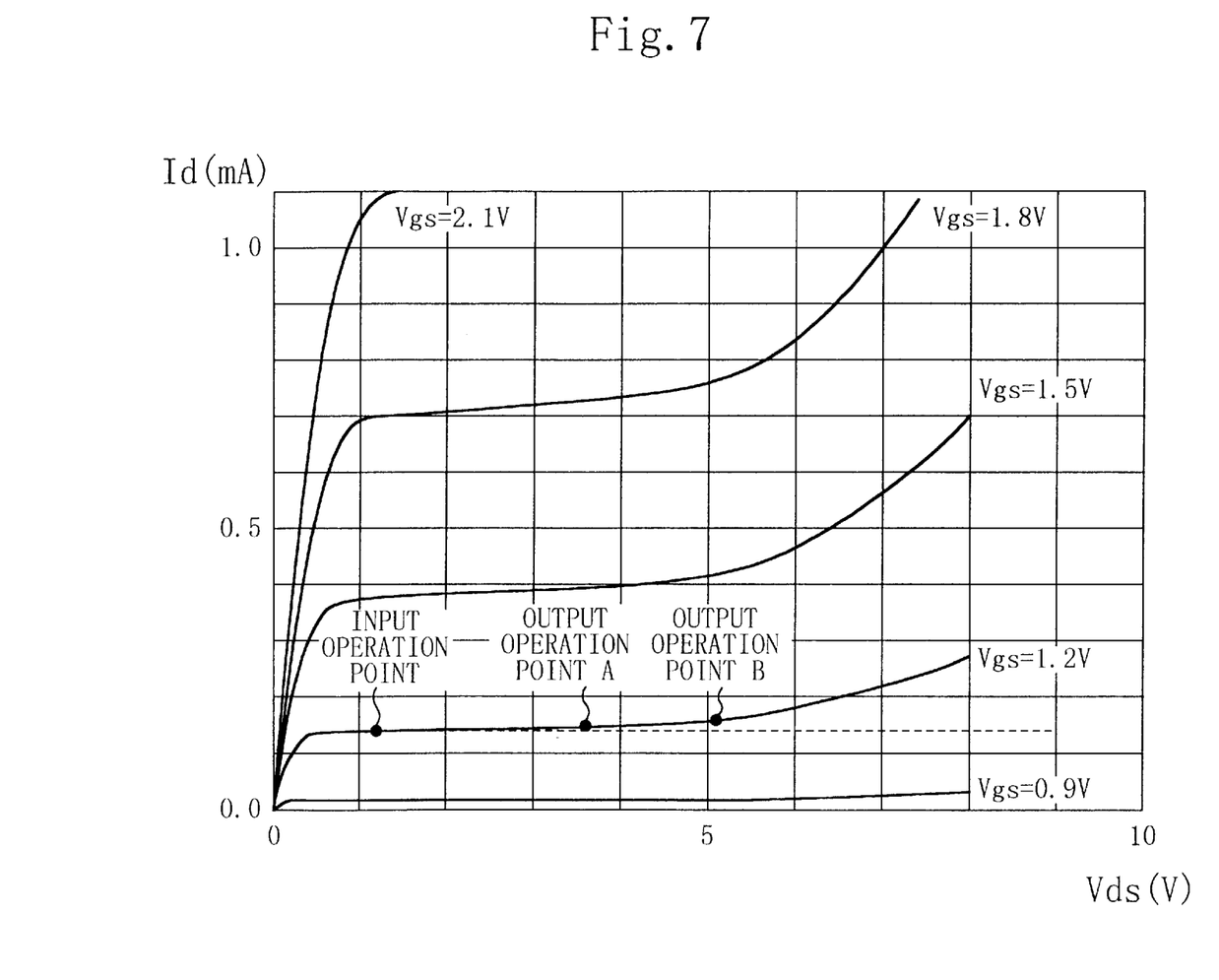
FIG. 7 is a graph illustrating the Vds-Id characteristics of an NMOF transistor.

FIG. 7 is a graph illustrating the Vds-Id characteristics between the drain-source voltage and the drain current of an NMOS transistor having a wide, long gate. In FIG. 7, the actually measured value of the threshold voltage is about 0.6 V. In the saturation region of the Vds-Id characteristics, as the drain-source voltage Vds increases, the drain current Id slightly increases.

For example, a case where the gate-source voltage Vgs is 1.2 V will be considered.

First, in a region where the drain-source voltage Vds is lower than the voltage at the output operation point A of the NMOS transistor, as the drain-source voltage Vds increases, the drain current Id slightly increases. If the gate-source voltage Vgs is 1.5 V, the increase of the drain current Id is more remarkable. The increase of the drain current Id in such a saturation region may be attributed to the short channel effects resulting from the expansion of a depletion layer in the gate in the vicinity of the drain in accordance with the increase of the drain-source voltage Vds.

Next, if the drain-source voltage Vds is higher than the output operation point A, as the drain-source voltage Vds increases, the drain current Id starts to greatly increase. This drastic increase can be explained by the phenomenon that hot electrons generated by a high electric field at the end of the drain of the NMOS transistor increases substrate current flowing from the drain directly into the substrate.

Because of these two reasons, the drain current Id cannot be kept constant in the saturation region. Thus, in a current mirror circuit using an MOS transistor having such characteristics as those illustrated in FIG. 7, since the drain current Id cannot be approximated at a constant value in the saturation region of the MOS transistor, the input current cannot be mirrored precisely.

The operation of the current mirror circuit shown in FIG. 6 will be described with reference to FIG. 7.

The input transistor N1L and the output transistor N1R both have a threshold voltage Vtn (=0.6 V) and exhibit the Vds-Id characteristics shown in FIG. 7. A gate-source voltage Vgs of 1.2 V is applied to both transistors. The input operation point (see FIG. 7) of the input transistor N1L is set at a drain-source voltage Vds (=1.2 V), which is a little higher than the threshold voltage Vtn. Herein, the threshold voltage of the input transistor P2L in the output current mirror circuit is denoted by Vtp.

If the power supply voltage VDD is 5 V, the output transistor N1R is designed to have a drain-source voltage Vds at a level slightly lower than VDD−Vtp (V), e.g., 3.6 V. The drain-source voltage Vds (=3.6 V) corresponds to the output operation point A (see FIG. 7) of the output transistor N1R. Thus, when the power supply voltage VDD is 5 V, the output transistor N1R operates at the output operation point A shown in FIG. 7. Accordingly, the drain current Id of the output transistor N1R has hardly increased from the drain current of the input transistor N1L, i.e., the input current Ii.

If the power supply voltage VDD is further increased to be set at 6.5 V, for example, the drain-source voltage Vds of the output transistor N1R becomes 5.1 V. The drain-source voltage Vds (=5.1 V) corresponds to the output operation point B (see FIG. 7) of the output transistor N1R. As can be understood from FIG. 7, the drain current of the output transistor N1R has increased from the input current Ii by about 10% in this case.

If the power supply voltage VDD is even more increased, then the drain-source voltage Vds of the output transistor N1R further increases and the drain current also increases. As a result, the output current Io of the Pch current mirror circuit drastically increases. Consequently, the mirror relationship collapses suddenly.

As described above, if the power supply voltage VDD is high, the conventional MOS semiconductor integrated circuit including a current mirror circuit cannot ensure sufficient mirror operation precision. Thus, the operability range of such an integrated circuit has an adversely low upper limit.

In order to improve the precision of such a current mirror circuit, a cascaded current mirror circuit is used. A cascaded current mirror circuit will be described with reference to FIG. 8.

Figure 8:
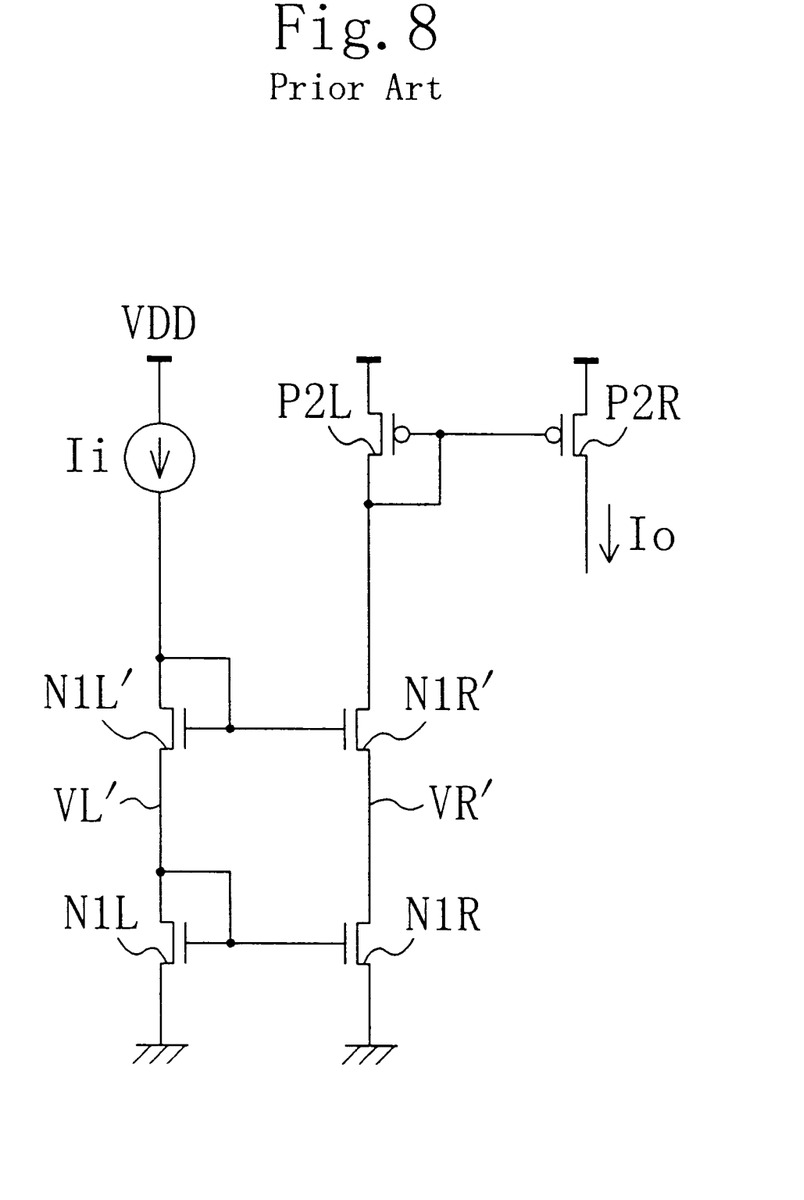
FIG. 8 is a circuit diagram of a cascaded current mirror circuit.

FIG. 8 is a circuit diagram of a cascaded current mirror circuit. In FIG. 8, the same components as those of the current mirror circuit shown in FIG. 6 will be identified by the same reference numerals and the description thereof will be omitted herein.

NMOS transistors N1L' and N1R' are serially connected to the input and output transistors N1L and N1R, respectively, which constitute a current mirror circuit. The input transistor N1L' is diode-connected and the gate of the transistor N1L' is connected to the gate of the output transistor N1R'. In such a circuit configuration, the drain voltage VL' of the input transistor N1L can be substantially equalized with the drain voltage VR' of the output transistor N1R. Thus, the drain current of the transistors N1L and N1R, constituting the current mirror circuit, is hardly dependent on the drain voltage.

However, since the input operation point of the input transistor N1L is located at a drain-source voltage Vds (=1.2 V) slightly higher than the threshold voltage Vtn, the drain voltage VR' of the output transistor N1R, i.e., the source voltage of the transistor N1R' serially connected to the output transistor N1R, also becomes about 1.2 V. Thus, in the transistor N1R', the value of the power supply voltage VDD, at which the substrate current directly flowing from the drain to the substrate starts to increase, is higher than that of an ordinary current mirror circuit by as small as about 1.2 V. In other words, the cascaded current mirror circuit cannot expand the range of, i.e., increase the upper limit of, the power supply voltage VDD allowing for high-precision current mirroring by only about 1.2 V.

SUMMARY OF THE INVENTION

In view of the above-described conventional problems, the object of the present invention is to provide an MOS semiconductor integrated circuit that can mirror current with high precision even when the power supply voltage VDD is high.

In order to accomplish this object, the MOS semiconductor integrated circuit including a current mirror circuit according to the present invention includes: at least one serial transistor of a first conductivity type connected between the drain of an output transistor of the first conductivity type of the current mirror circuit and the output of the current mirror circuit; at least one constant current source, each generating constant current; and at least one reference voltage transistor, serially connected between the or each said constant current source and ground and connected to operate as a diode, for applying a reference voltage or mutually different reference voltages to the gate of the or each said serial transistor.

In this configuration, in accordance with the reference voltage applied to the gate of each serial transistor, the drain-source voltages of each serial transistor and the output transistor can be reduced to a predetermined value or less.

According to the present invention, since the output transistor and the serial transistors operate in the saturation region of the Vds-Id characteristics, the range of the power supply voltage allowing for high-precision current mirroring can be expanded, i.e., the upper limit of the range can be increased. In addition, since the drain voltages of the transistors symmetrically disposed in the current mirror circuit are equalized, current can be mirrored with an accurate mirror ratio.

DETAILED DESCRIPTION OF THE INVENTION

EMBODIMENT 1

Hereinafter, an MOS semiconductor integrated circuit in the first embodiment of the present invention will be described with reference to the drawings.

Figure 1:
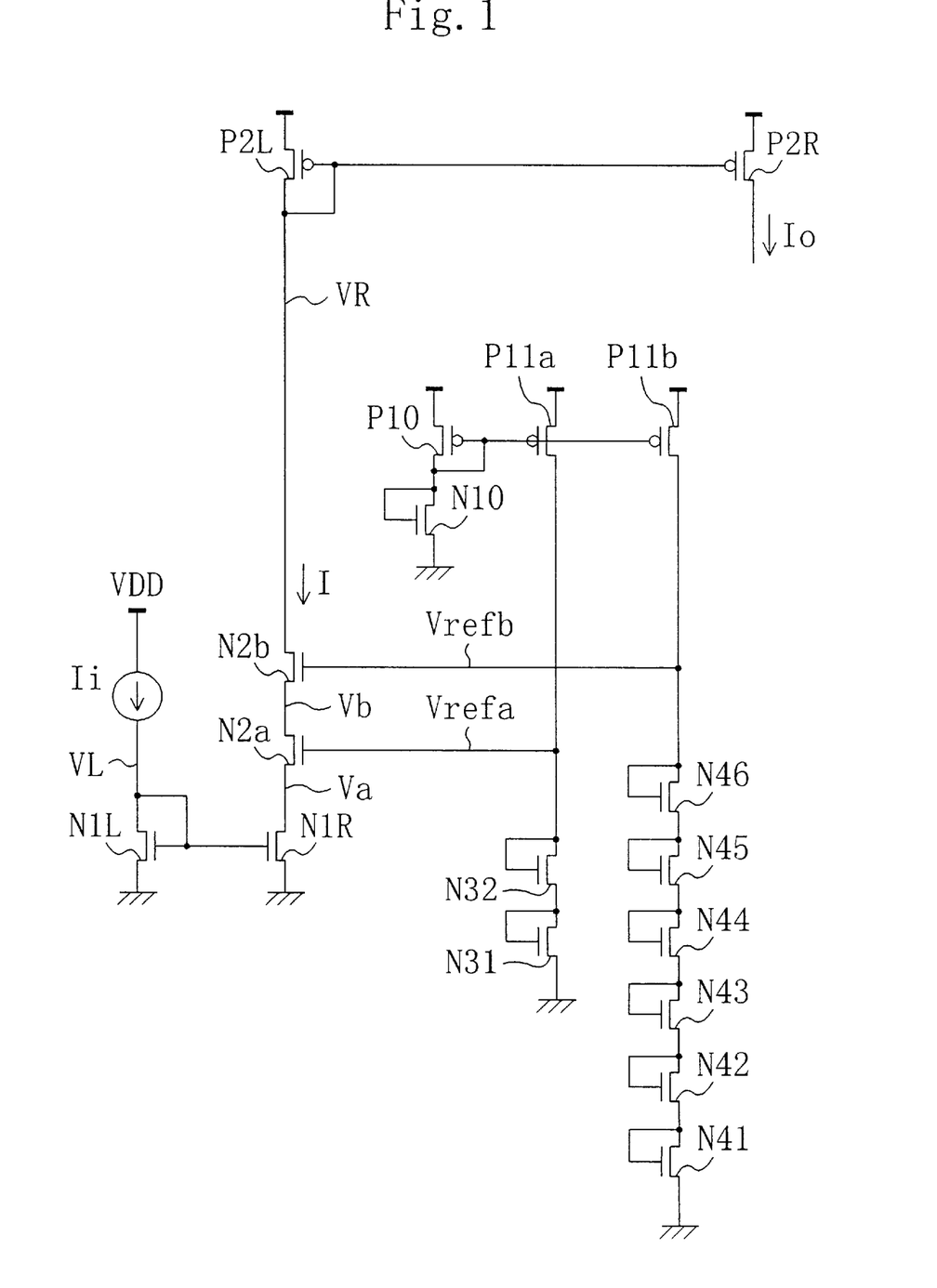
FIG. 1 is a circuit diagram of a current mirror circuit included in an MOS semiconductor integrated circuit in the first embodiment of the present invention.

FIG. 1 is a circuit diagram of a current mirror circuit included in an MOS semiconductor integrated circuit in the first embodiment of the present invention. In FIG. 1, the same components as those of the conventional circuit shown in FIG. 6 will be identified by the same reference numerals and the description thereof will be omitted herein.

In FIG. 1, serial transistors N2$a$ and N2$b$ are NMOS transistors, which are sequentially and serially connected to the drain of the output transistor N1R of an Nch current mirror circuit. The drain of the serial transistor N2$b$ is connected to the drain of an input transistor P2L of an output current mirror circuit. PMOS transistors P10, P11$a$ and P11$b$ constitute a Pch current mirror circuit functioning as constant current sources. An NMOS transistor N10 is a load of the PMOS transistor P10.

Two reference voltage transistors N31 and N32 generate a first reference voltage Vrefa to be applied to the gate of the serial transistor N2$a$. Each of the transistors N31 and N32 is a diode-connected NMOS transistor, and these transistors N31 and N32 are serially connected to each other. Six reference voltage transistors N41 to N46 generate a second reference voltage Vrefb to be applied to the gate of the serial transistor N2$b$. Each of the transistors N41 to N46 is a diode-connected NMOS transistor and these transistors N41 to N46 are also serially connected to each other.

The sizes of the serial transistors N2$a$, N2$b$ are designed such that the serial transistors N2$a$, N2$b$ have sufficient current drivability with respect to the mirror current I, which is the output current of the Nch current mirror circuit. The gate-source voltage of the serial transistors N2$a$, N2$b$ is set equal to or smaller than a predetermined voltage larger than the threshold voltage Vtn of the serial transistors, preferably at Vtn+2 (V) or less.

The operation of the Pch current mirror circuit functioning as constant current sources and the generation of the respective reference voltages will be described. Constant current corresponding to the current flowing through the PMOS transistor P10 flows through the PMOS transistors P11a, P11b. In other words, the PMOS transistors P11a, P11b are constant current sources for generating constant current having the same value. The first reference voltage Vrefa is generated by making the constant current supplied from the PMOS transistor P11a flow through the reference voltage transistors N31, N32. Similarly, the second reference voltage Vrefb is generated by making the constant current supplied from the PMOS transistor P11b flow through the reference voltage transistors N41 through N46.

The characteristics of the respective reference voltages shown in FIG. 1 will be described with reference to FIG. 2.

Figure 2:
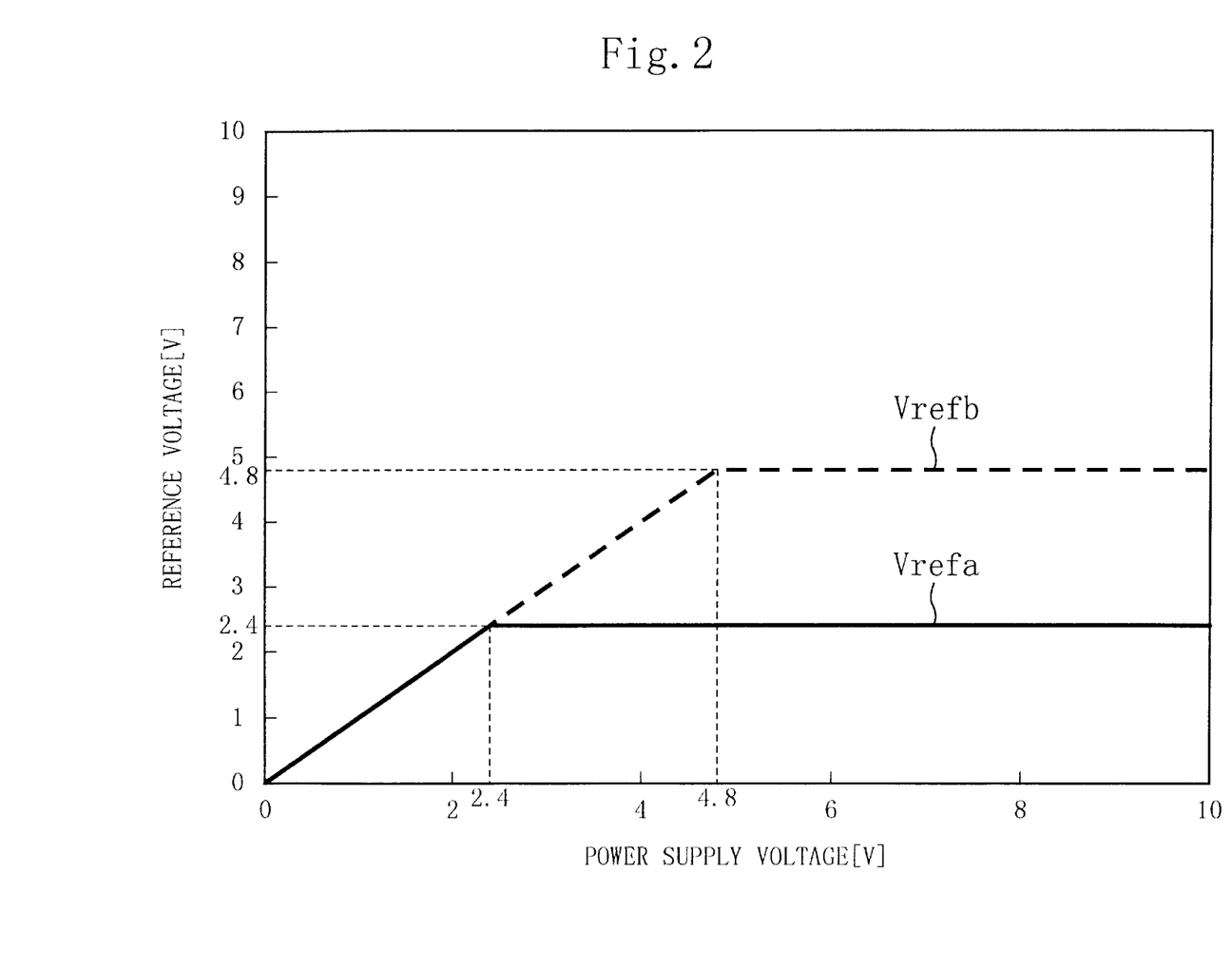
FIG. 2 Is a graph illustrating the relationship between the first and second reference voltages and a power supply voltage.

FIG. 2 is a graph illustrating the relationship between the first and second reference voltages Vrefa and Vrefb and the power supply voltage VDD. The characteristics shown in FIG. 2 are realized by controlling the sizes of the respective reference voltage transistors and the values of the current supplied from the constant current sources.

As shown in FIG. 2, each of the first and second reference voltages Vrefa, Vrefb is set equal to the power supply voltage VDD until the power supply voltage VDD reaches a predetermined voltage associated with each reference voltage. Then, on and after the power supply voltage VDD exceeds the associated predetermined voltage, each of the first and second reference voltages Vrefa, Vrefb is set equal to the associated predetermined voltage.

Thus, on and after the power supply voltage VDD exceeds the predetermined voltage associated with the higher, second reference voltage Vrefb, the potential difference between the first and second reference voltages Vrefa and Vrefb is constant. The potential difference is set equal to or smaller than a predetermined level. On the other hand, the value of the lower, first reference voltage Vrefa is set such that the source voltage Va of the serial transistor N2a2, receiving the first reference voltage Vrefa at the gate thereof, becomes a predetermined value or less. That is to say, the drain voltage of the output transistor N1R of the current mirror circuit is suppressed at the predetermined value or less.

The operation of the current mirror circuit shown in FIG. 1 will be described while referring to FIGS. 2 and 7 and using specific values.

In FIG. 2, the predetermined power supply voltage VDD associated with the first reference voltage Vrefa is set at 2.4 V, while the predetermined power supply voltage VDD associated with the second reference voltage Vrefb is set at 4.8 V. The gate voltage of the input and output transistors N1L, N1R, i.e., the input voltage VL, is set at 1.2 V.

First, the operation point of the output transistor N1R will be described where the power supply voltage VDD is equal to or larger than 4.8 V. The drain voltage of the output transistor N1R is restricted by the voltage Va, i.e., the source voltage of the serial transistor N2a receiving the first reference voltage Vrefa as a gate voltage. That is to say, the drain-source voltage of the output transistor N1R is given by:

$$Vrefa - Vtn - \alpha = 2.4 - 0.6 - \alpha = 1.8 - \alpha (V)$$

where $\alpha$ is a predetermined constant. Thus, the drain-source voltage of the output transistor N1R at the operation point thereof can be set at a value, which is not so different from the input operation point (=1.2 V) shown in FIG. 7 and is lower than the output operation point A (=3.6 V) shown in FIG. 7. If the drain-source voltage Vds of the output transistor N1R is in the range from the input operation point (=1.2 V) to the output operation point A (=3.6 V) as shown in FIG. 7, then the drain current Id at the operation point of the output transistor N1R increases from the drain current at the input operation point (=1.2 V) shown in FIG. 7 only slightly.

Also, in order to operate the output transistor N1R within the saturation region, the drain voltage of the output transistor N1R should be equal to or larger than a value obtained by subtracting the threshold voltage Vtn from the gate voltage equal to the input voltage VL (=VL−Vtn).

The size of the serial transistor N2a is determined such that the source voltage of the serial transistor N2a satisfies this condition. By adjusting the size of the serial transistor N2a, the drain-source voltage of the output transistor N1R can be further close to the input operation point (=1.2 V) shown in FIG. 7. Since the operation point of the output transistor N1R can be optimized in this way, the precision of the mirror ratio between the input current Ii and the mirror current I can be improved in the current mirror circuit.

Next, the operation point of the serial transistor N2a will be described. The size of the serial transistor N2a is determined such that the voltage Va, i.e., the source voltage thereof, becomes 1.2 V with respect to the first reference voltage Vrefa (=2.4 V) applied to the gate thereof. The size of the serial transistor N2b is determined such that the voltage Vb, i.e., the source voltage thereof, becomes 3.6 V with respect to the second reference voltage Vrefb (=4.8 V) applied to the gate thereof. As a result, the drain-source voltage Vds of the serial transistor N2a can be set at 2.4 V, which is lower than the voltage at the output operation point A (=3.6 V) shown in FIG. 7. Accordingly, since no hot electrons are generated at the end of the drain of the serial transistor N2a, the substrate current directly flowing from the drain into the substrate can be suppressed.

On the other hand, in order to prevent hot electrons from being generated at the end of the drain of the serial transistor N2b, the drain-source voltage Vds thereof may be set at 3.6 V as shown in FIG. 7. Thus, the maximum output voltage VR at which the current mirror circuit can mirror current with high precision (=Vb+Vds of N2b) is 7.2 V and the value of the corresponding power supply voltage VDD also increases. Therefore, as compared with the maximum output voltage (=3.6 V) of a conventional current mirror circuit, the output voltage VR can be considerably increased. As a result, the upper limit of the applicable power supply voltage VDD can be remarkably increased.

As described above, in this embodiment, an MOS transistor of an appropriate size is serially connected to the output transistor of a current mirror circuit, and an appropriate reference voltage is applied to the gate of the MOS transistor. As a result, the output transistor and the MOS transistor connected thereto can operate within the respectively predetermined ranges of drain-source voltages Vds, i.e., within the saturation regions of the Vds-Id characteristics. Consequently, the range of the power supply voltage VDD in which current can be mirrored with high precision can be expanded, i.e., the upper limit thereof can be increased.

In the description of this embodiment, the number of serial transistors is assumed to be two. However, the present invention is not limited thereto. Even if the number of serial transistors is one, the range of the power supply voltage VDD in which current can be mirrored with high precision can be naturally expanded.

Alternatively, extra serial transistors may be added and an appropriate reference voltage may be applied to the gate of each of these additional serial transistors. In such a case, the range of the power supply voltage VDD in which current can be mirrored with high precision can be further expanded.

Also, the reference voltage transistors may be any transistor other than an NMOS transistor.

EMBODIMENT 2

Hereinafter, an MOS semiconductor integrated circuit in the second embodiment of the present invention will be described with reference to the drawings.

Figure 3:
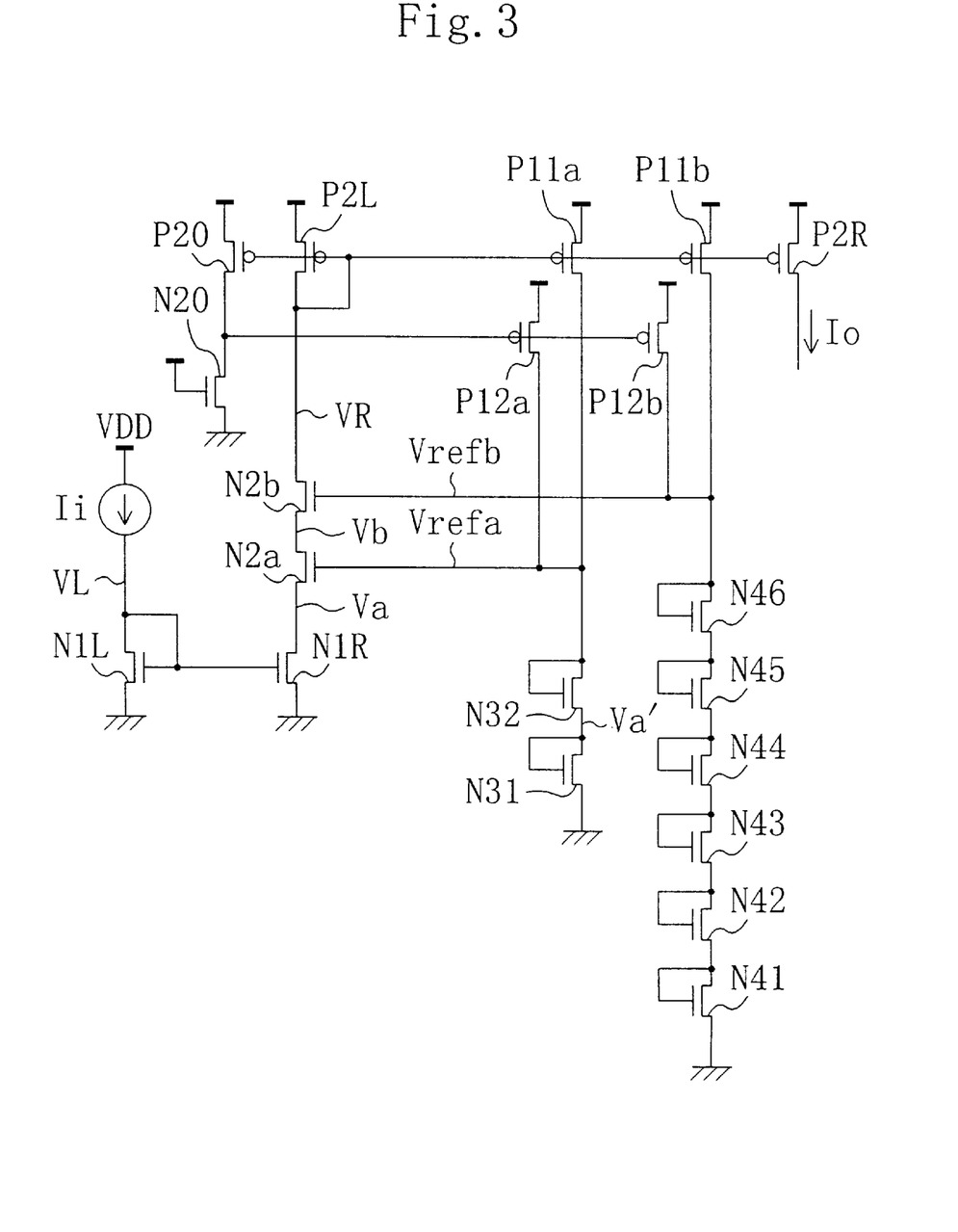
FIG. 3 s a circuit diagram of a current mirror circuit included in an MOS semiconductor integrated circuit in the second embodiment of the present invention.

FIG. 3 is a circuit diagram of a current mirror circuit included in an MOS semiconductor integrated circuit in the second embodiment of the present invention. In FIG. 3, the same components as those of the first embodiment shown in FIG. I will be identified by the same reference numerals and the description thereof will be omitted herein.

In FIG. 3, PMOS transistors P2L, P2R, P11a, P11b and P20 constitute a Pch current mirror circuit. The PMOS transistors P2L and P2R constitute an output current mirror circuit. The gate of the PMOS transistor P2L is connected to the gates of the PMOS transistors P2R, P11a, P11b and P20.

The PMOS transistors P11a and P11bof the Pch current mirror circuit are constant current sources constituting a reference voltage current mirror circuit. The drains of the PMOS transistors P11a and P11bare connected to the drains of reference voltage transistors N32 and N46, respectively.

An NMOS transistor N20 is a load circuit connected to one of the outputs of the Pch current mirror circuit. The NMOS transistor N20 and the PMOS transistor P20 constitutes an inverter.

PMOS transistors P12a and P12b are startup transistors. The gates of the PMOS transistors P12a and P12b are connected to the output of the inverter, i.e., the drain of the PMOS transistor P20. The drains of the PMOS transistors P12a and P12b are connected to the gates of serial transistors N2aand N2b, respectively. And the sources of the PMOS transistors P12a and P12bare connected to the power supply voltage VDD.

The operation of the reference voltage current mirror circuit shown in FIG. 3 will be described.

The current flowing through the output transistor N1R is mirrored by the PMOS transistors P2R, P11a, P11band P20 via the input transistor P2L. Thus, current having an amount n times as large as that of the input current Ii (where n is a constant) can be supplied as a load to the PMOS transistor P11a functioning as a constant current source of the reference voltage current mirror circuit. By setting the sizes of the reference voltage transistors N31 and N32 to be n times as large as those of the output transistor N1R and the serial transistor N2a, respectively, a voltage Va' can be equalized with the voltage Va and with the input voltage VL. This means equalizing the drain voltages of transistors symmetrically disposed in the current mirror circuit. Thus, current can be mirrored with a precise mirror ratio.

The operation of the startup transistors P12aand P12b shown in FIG. 3 will be described.

When power is supplied to this current mirror circuit, the first and second reference voltages Vrefa and Vrefb are both 0 V, and the serial transistors N2aand N2bare both OFF. Thus, no current flows to the input transistor P2L, and no current flows to the output transistor P2R, either. As a result, the output current Io does not flow. Similarly, since no current flows to the PMOS transistors P11a and P11b, no current flows to the reference voltage transistors N31, N32 and N41 through N46. Since the first and second reference voltages Vrefa and Vrefb both remain 0 V, the output current Io does not flow, and the current mirror circuit does not operate.

In order to avoid such a state, the gate voltage of the input transistor P2L is inverted by the inverter formed by the NMOS transistor N20 and the PMOS transistor P20, and the inverted voltage is applied to the gates of the startup transistors P12a and P12b.

Since no current flows to the input transistor P2L when the power is supplied, the gate voltage thereof is at "H" level. Thus, since the output of the inverter turns to "L" level, both the startup transistors P12aand P12bare turned ON. Then, since current flows to the reference voltage transistors N31, N32 and N41 through N46, the first and second reference voltages Vrefa and Vrefb are generated. And the serial transistors N2aand N2bare both turned ON and current flows to the input transistor P2L. As a result, the current to the output transistor P2R, i.e., the output current Io, flows and the current mirror circuit starts to operate. In such a state, the input of the inverter, i.e., the gate voltage of the PMOS transistor P20, turns to "L" level, and the output of the inverter, i.e., the drain voltage of the PMOS transistor P20, turns to "H" level. As a result, the startup transistors P12aand P12bare both turned OFF.

As described above, in this embodiment, the Pch transistors P11a and P11bfunctioning as constant current sources are provided for the Pch current mirror circuit as an output current mirror circuit for supplying output current Io. Thus, current having an amount n times as large as that of the input current Ii flows through the reference voltage transistors N31 and N32. Accordingly, if the reference voltage transistors N31 and N32 are appropriately designed with respect to the output transistor N1R and the serial transistor N2a, then the voltage Va' can be equalized with the voltage Va and eventually with the input voltage VL. As a result, since the drain voltages of transistors symmetrically disposed in a current mirror circuit can be equalized, current can be mirrored with a precise mirror ratio.

In the description of this embodiment, a circuit formed by the serial transistor N2a, the PMOS transistor P11a and the reference voltage transistors N31 and N32 has been exemplified. It should be noted that a circuit formed by the serial transistor N2b, the PMOS transistor P11band the reference voltage transistors N41 through N46 operates the same way.

EMBODIMENT 3

Hereinafter, an MOS semiconductor integrated circuit in the third embodiment of the present invention will be described with reference to the drawings.

Figure 4:
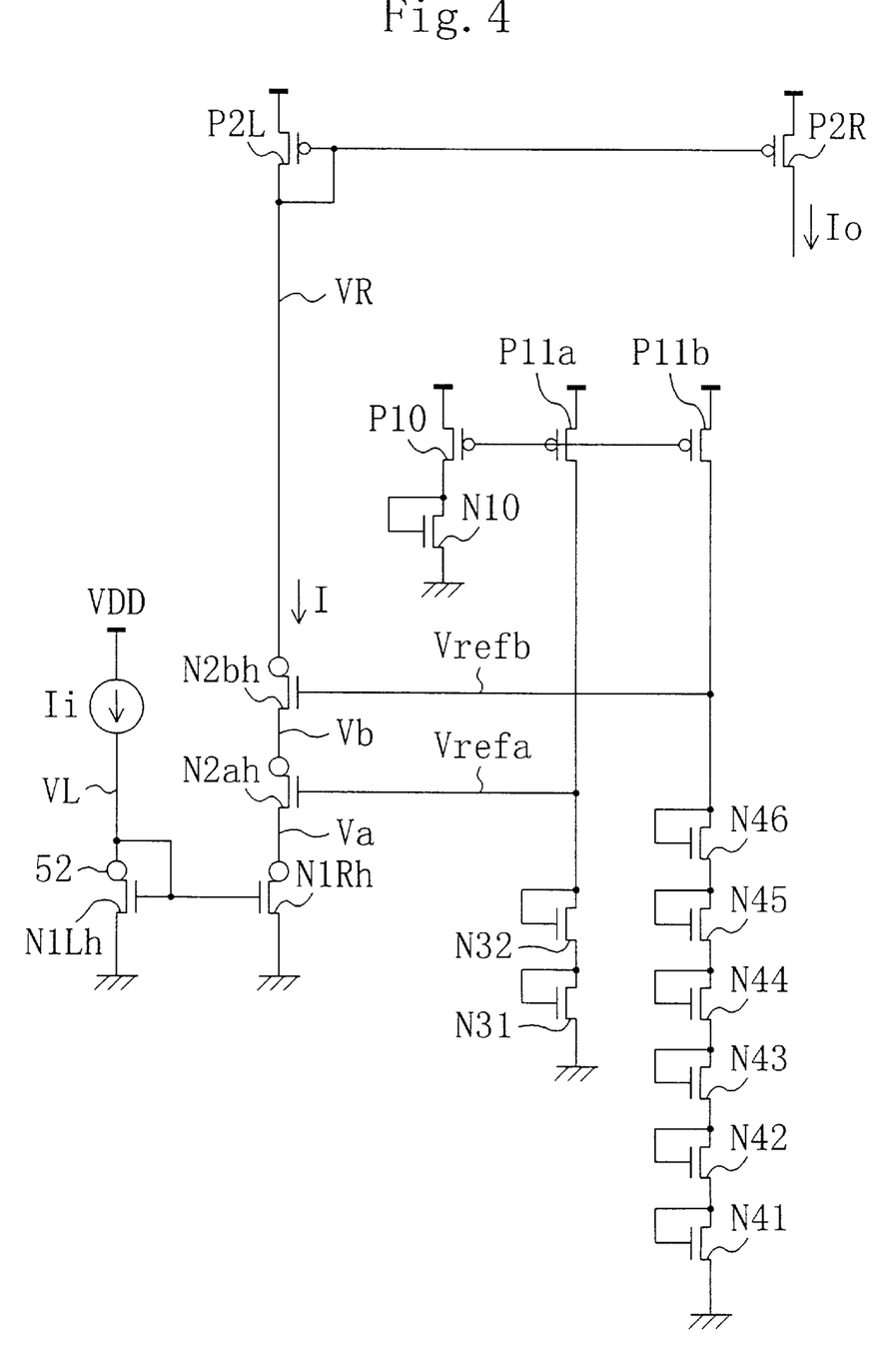
FIG. 4 is a circuit diagram of a current mirror circuit included in an MOS semiconductor integrated circuit in the third embodiment of the present invention.

FIG. 4 is a circuit diagram of a current mirror circuit included in an MOS semiconductor integrated circuit in the third embodiment of the present invention. In FIG. 4, the same components as those of the first embodiment shown in FIG. 1 will be identified by the same reference numerals and the description thereof will be omitted herein.

In FIG. 4, an input transistor N1Lh, an output transistor N1Rh and serial transistors N2ah and N2bh of this current mirror circuit all have a structure for a high breakdown voltage (hereinafter, referred to as a "high breakdown voltage structure"). That is to say, each of these is an NMOS transistor including a drain 52 having a structure enabling a high breakdown voltage.

Figure 5:
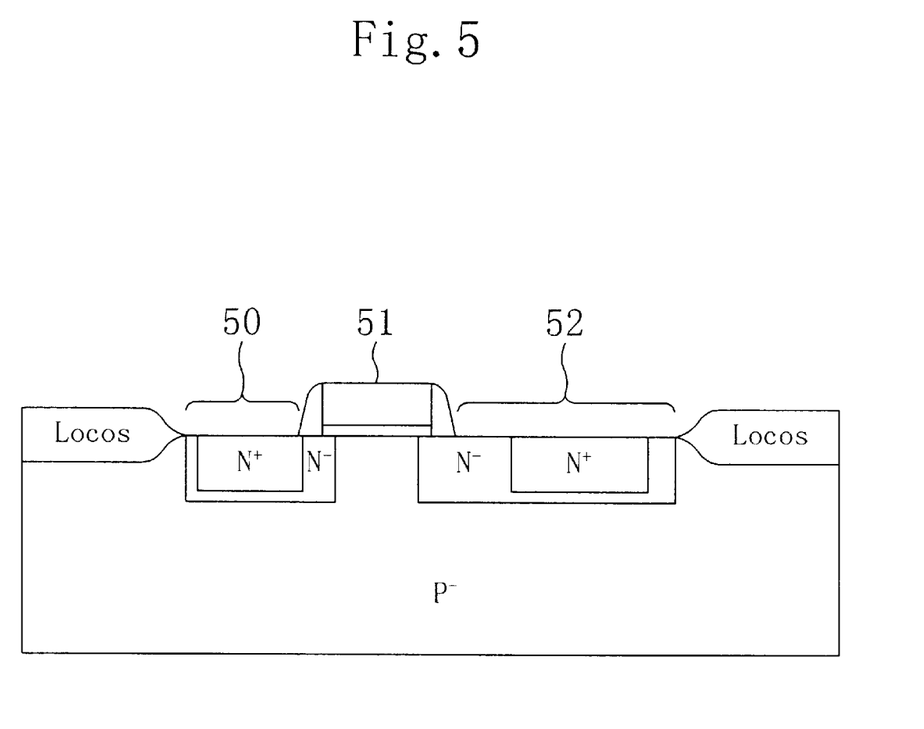
FIG. 5 is a cross-sectional view of an NMOS transistor including a drain having a structure for high breakdown voltage.

FIG. 5 is a cross-sectional view of an NMOS transistor including a drain having a high breakdown voltage structure.

In FIG. 5, a source 50, a gate 51 and the drain 52 having a high breakdown voltage structure constitute an NMOS transistor. In the NMOS transistor, a first distance between the end of an N$^+$highly doped region of the drain 52 closer to the gate 51 and the end of the gate 51 closer to the drain 52 is set longer than a second distance between the end of an N⁺ highly doped region of the source 50 closer to the gate 51 and the end of the gate 51 closer to the source 50. Such a structure can be formed through mask offsetting, i.e., by setting the first distance longer than the second distance in a mask for forming the N⁺highly doped regions. As a result, since the electric field in the vicinity of the drain is weakened, the breakdown voltage of the drain can be increased and the substrate current can be reduced with respect to the same value of drain-source voltage Vds. The high breakdown voltage structure is applicable to other parts of the transistor than the drain.

As described above, in this embodiment, if the same mirror precision is to be ensured, as the first embodiment the breakdown voltage of the drain can be increased and the current mirror circuit can be operated with a higher power supply voltage VDD. Also, since the number of the output transistor N1Rh and the serial transistors N2ah and N2bh, is equal to the first embodiment the substrate current is reduced with respect to the same value of power supply voltage VDD. As the first embodiment as a result, the mirror precision can be improved.

What is claimed is:

1. A MOS semiconductor integrated circuit comprising:
   a current mirror circuit including an input transistor of a first conductivity type for receiving an input current from an input current source and an output transistor of the first conductivity type for supplying current corresponding to the input current to an output of the current mirror circuit;
   a serial transistor of the first conductivity type connected between the drain of the output transistor and the output of the current mirror circuit, the source of the serial transistor being connected to the drain of the output transistor, a reference voltage being applied to the gate of the serial transistor; and
   control means for controlling the reference voltage so that the reference voltage is set equal to a power supply voltage until the power supply voltage reaches a predetermined voltage associated with the reference voltage, and the reference voltage is set equal to the associated predetermined voltage when the power supply voltage exceeds the associated predetermined voltage.

2. The MOS semiconductor integrated circuit of claim 1, wherein the control means comprises:
   a constant current source for generating constant current, the constant current source being different from the input current source; and
   at least one reference voltage transistor, serially connected between the constant current source and ground and connected to operate as a diode, for generating the reference voltage.

3. The MOS semiconductor integrated circuit of claim 2, wherein the constant current source generates current in proportion to the input current of the current mirror circuit.

4. The MOS semiconductor integrated circuit of claim 2, wherein the constant current source is constituted by a reference voltage current mirror circuit including a transistor of a second conductivity type and having a plurality of mirror outputs, the transistor of the second conductivity type being connected to the drain of the serial transistor,
   and wherein a first one of the mirror outputs is connected to the gate of the serial transistor.

5. The MOS semiconductor integrated circuit of claim 4, further comprising:
   a load circuit connected to a second one of the mirror outputs; and
   a startup transistor of the second conductivity type, the second mirror output being applied to the gate of the startup transistor, the gate of the serial transistor being connected to the drain of the startup transistor, and a power supply voltage being applied to the source of the startup transistor.

6. The MOS semiconductor integrated circuit of claim 1, wherein a structure for a high breakdown voltage is provided at least at the drain of the input transistor and the drain of the output transistor of the first conductivity type and/or at least at the drain of the serial transistor.

7. An MOS semiconductor integrated circuit comprising:
   a current mirror circuit including an input transistor of a first conductivity type for receiving an input current from an input current source and an output transistor of the first conductivity type for supplying current corresponding to the input current to an output of the current mirror circuit;
   a first serial transistor of the first conductivity type connected between the drain of the output transistor and the output of the current mirror circuit, the source of the first serial transistor being connected to the drain of the output transistor, a first reference voltage being applied to the gate of the first serial transistor;
   a second serial transistor of the first conductivity type connected between the drain of the first serial transistor and the output of the current mirror circuit, the source of the second serial transistor being connected to the drain of the first serial transistor, a second reference voltage being applied to the gate of the second serial transistor; and
   control means for controlling the first and second reference voltages so that each one of the first and second reference voltages is set equal to a power supply voltage until the power supply voltage reaches a predetermined voltage associated with each one of the first and second reference voltages, and each one of the first and second reference voltages is set equal to the associated predetermined voltage when the power supply voltage exceeds the associated predetermined voltage.

8. The MOS semiconductor integrated circuit of claim 7, wherein the second reference voltage is equal to or higher than the first reference voltage.

9. The MOS semiconductor integrated circuit of claim 7, wherein the control means comprises:
   two constant current sources, each generating constant current, the two constant current sources being different from the input current source, respectively; and
   at least two reference voltage transistors, each serially connected between an associated one of the two constant current sources and ground and connected to operate as a diode, for generating the first and second reference voltages, respectively.

10. The MOS semiconductor integrated circuit of claim 9, wherein each of the two constant current sources generates current in proportion to the input current of the current mirror circuit.

11. The MOS semiconductor integrated circuit of claim 9, wherein the two constant current sources are constituted by a reference voltage current mirror circuit including a transistor of a second conductivity type and having a plurality mirror outputs, the transistor of the second conductivity type being connected to the drain of the second serial transistor, and wherein a first one of the mirror outputs is connected to the gate of the first serial transistor, and a second one of the mirror outputs is connected to the gate of the second serial transistor.

12. The MOS semiconductor integrated circuit of claim 11, further comprising:
a load circuit connected to a third one of the mirror outputs;
a first startup transistor of the second conductivity type, the third mirror output being applied to the gate of the first startup transistor, the gate of the first serial transistor being connected to the drain of the first startup transistor, and a power supply voltage being applied to the source of the first startup transistor; and
a second startup transistor of the second conductivity type, the third mirror output being applied to the gate of the second startup transistor, the gate of the second serial transistor being connected to the drain of the second startup transistor, and the power supply voltage being applied to the source of the second startup transistor.

13. The MOS semiconductor integrated circuit of claim 7, wherein a structure for a high breakdown voltage is provided at least at the drains of the input and output transistors of the first conductivity type and/or at least at the drain of the first and second serial transistor.

14. A MOS semiconductor integrated circuit comprising:
a current mirror circuit including an input transistor of a first conductivity type for receiving an input current and an output transistor of the first conductivity type for supplying current corresponding to the input current to an output of the current mirror circuit;
a serial transistor of the first conductivity type connected between the drain of the output transistor and the output of the current mirror circuit, the source of the serial transistor being connected to the drain of the output transistor, a reference voltage having an intermediate value between a power supply voltage and a ground being applied to the gate of the serial transistor;
a constant current source for generating constant current; and
at least one reference voltage transistor, serially connected between the constant current source and ground and connected to operate as a diode, for generating the reference voltage,
wherein the constant current source is constituted by a reference voltage current mirror circuit including a transistor of a second conductivity type and having a plurality of mirror outputs, the transistor of the second conductivity type being connected to the drain of the serial transistor,
and wherein a first one of the mirror outputs is connected to the gate of the serial transistor.

15. The MOS semiconductor integrated circuit of claim 14, further comprising:
a load circuit connected to a second one of the mirror outputs; and
a startup transistor of the second conductivity type, the second mirror output being applied to the gate of the startup transistor, the gate of the serial transistor being connected to the drain of the startup transistor, and a power supply voltage being applied to the source of the startup transistor.

16. A MOS semiconductor integrated circuit comprising:
a current mirror circuit including an input transistor of a first conductivity type for receiving an input current and an output transistor of the first conductivity type for supplying current corresponding to the input current to an output of the current mirror circuit;
a first serial transistor of the first conductivity type connected between the drain of the output transistor and the output of the current mirror circuit, the source of the first serial transistor being connected to the drain of the output transistor, a first reference voltage having an intermediate value between a power supply voltage and a ground being applied to the gate of the first serial transistor;
a second serial transistor of the first conductivity type connected between the drain of the first serial transistor and the output of the current mirror circuit, the source of the second serial transistor being connected to the drain of the first serial transistor, a second reference voltage having a different value than the value of the first reference voltage being applied to the gate of the second serial transistor;
two constant current sources, each generating constant current; and
at least two reference voltage transistors, each serially connected between an associated one of the two constant current sources and ground and connected to operate as a diode, for generating the first and second reference voltages, respectively,
wherein the two constant current sources are constituted by a reference voltage current mirror circuit including a transistor of a second conductivity type and having a plurality of mirror outputs, the transistor of the second conductivity type being connected to the drain of the second serial transistor,
and wherein a first one of the mirror outputs is connected to the gate of the first serial transistor, and a second one of the mirror outputs is connected to the gate of the second serial transistor.

17. The MOS semiconductor integrated circuit of claim 16, wherein the second reference voltage is equal to or higher than the first reference voltage.

18. The MOS semiconductor integrated circuit of claim 16, further comprising:
a load circuit connected to a third one of the mirror outputs;
a first startup transistor of the second conductivity type, the third mirror output being applied to the gate of the first startup transistor, the gate of the first serial transistor being connected to the drain of the first startup transistor, and a power supply voltage being applied to the source of the first startup transistor; and
a second startup transistor of the second conductivity type, the third mirror output being applied to the gate of the second startup transistor, the gate of the second serial transistor being connected to the drain of the second startup transistor, and the power supply voltage being applied to the source of the second startup transistor.

19. A MOS semiconductor integrated circuit comprising:
a current mirror circuit including an input transistor of a first conductivity type for receiving an input current from an input current source and an output transistor of the first conductivity type for supplying current corresponding to the input current to an output of the current mirror circuit;
a serial transistor of the first conductivity type connected between the drain of the output transistor and the output of the current mirror circuit, the source of the serial transistor being connected to the drain of the output transistor, a reference voltage being applied to the gate of the serial transistor; and control means for controlling the reference voltage so that the reference voltage is set equal to a power supply voltage until the power supply voltage reaches a predetermined voltage associated with the reference voltage, and the reference voltage is set equal to the associated predetermined voltage when the power supply voltage exceeds the associated predetermined voltage;

wherein a structure for a high breakdown voltage is provided at least at the drain of the input transistor and the drain of the output transistor of the first conductivity type and/or at least at the drain of the serial transistor.

* * * * *